US007729096B2

(12) United States Patent
Hayashi

(10) Patent No.: US 7,729,096 B2
(45) Date of Patent: Jun. 1, 2010

(54) SEMICONDUCTOR INTEGRATED CIRCUIT

(75) Inventor: Hirokazu Hayashi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 50 days.

(21) Appl. No.: 12/073,194

(22) Filed: Mar. 3, 2008

(65) Prior Publication Data
US 2008/0225450 A1    Sep. 18, 2008

(30) Foreign Application Priority Data
Mar. 16, 2007 (JP) .............................. 2007-068146

(51) Int. Cl.
*H02H 9/00* (2006.01)
(52) U.S. Cl. ....................................................... 361/56
(58) Field of Classification Search ................. 361/56; 257/357, 350
See application file for complete search history.

(56) References Cited

U.S. PATENT DOCUMENTS

| 4,989,057 A | * | 1/1991 | Lu ........................... 257/357 |
| 5,828,106 A | * | 10/1998 | Sato ......................... 257/350 |

FOREIGN PATENT DOCUMENTS

| JP | 02-097066 | 4/1990 |
| JP | 09-064198 | 3/1997 |
| JP | 2001-144191 | 5/2001 |
| JP | 2002-076131 | 3/2002 |
| JP | 2002-324842 | 11/2002 |
| JP | 2005-093802 | 4/2005 |
| JP | 2006-086239 | 3/2006 |
| JP | 2006-270027 | 10/2006 |

OTHER PUBLICATIONS

A. Salman et al., "ESD Protection for SOI Technology using an Under-The-Box (Substrate) Diode Structure", AMD, EOS/ESD symp., 4B.2, 2004.

* cited by examiner

*Primary Examiner*—Jared J Fureman
*Assistant Examiner*—Angela Brooks
(74) *Attorney, Agent, or Firm*—Rabin & Berdo, P.C.

(57) ABSTRACT

A semiconductor integrated circuit having an ESD protection circuit enhancing a durability against thermal destruction is provided. The semiconductor integrated circuit configured by a plurality of MOSFETs each having an SOI structure formed on a silicon substrate includes a functional circuit having an external connection signal terminal, a pair of power terminals and at least one of the MOSFETs. The semiconductor integrated circuit also includes at least one ESD protection circuit having a first terminal and a second terminal connected to the signal terminal and the power terminals, respectively. The ESD protection circuit includes at least one first MOSFET of the MOSFETs formed on the silicon substrate. The first MOSFET has a drain connected to the first terminal, a gate connected to the second terminal, and a source connected to the second terminal. The at least one ESD protection circuit also includes at least one second MOSFET of the MOSFETs formed adjacent to the first MOSFET on the silicon substrate. The second MOSFET has a gate connected to the first terminal and the same conductivity type as the first MOSFET.

12 Claims, 6 Drawing Sheets

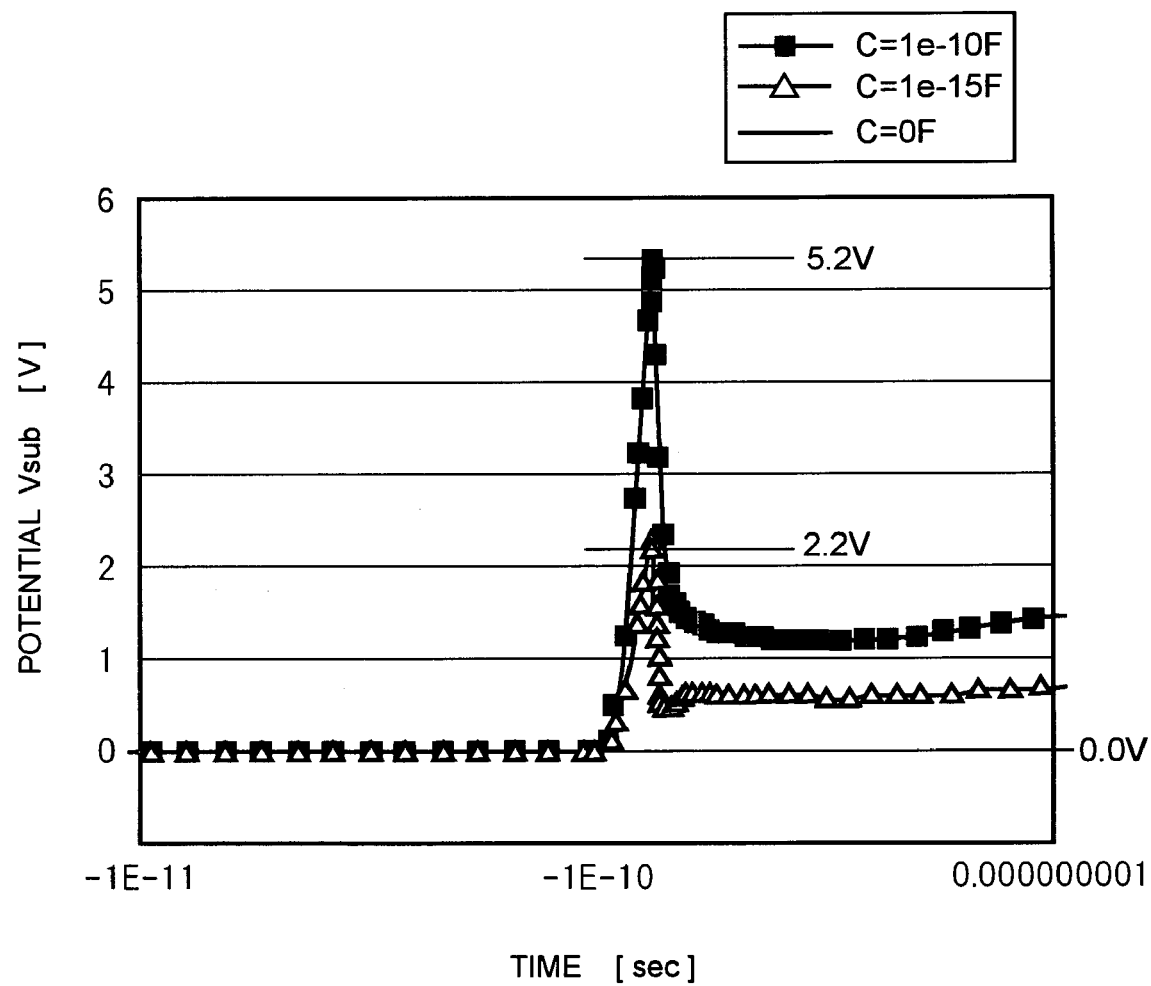

SEMICONDUCTOR INTEGRATED CIRCUIT

BACKGROUND OF THE INVENTION

1. Field of the Invention

The present invention relates to a large-scale integrated (LSI) circuit utilizing an SOI (Silicon on Insulator) substrate, and in particular relates to an LSI circuit having an ESD (Electro-Static Discharge) protection device.

2. Description of the Related Art

In a typical semiconductor integrated circuit, an ESD protection circuit is provided across an internal circuit and an input terminal (PAD) of the semiconductor integrated circuit, thus preventing an excess electric current flow to the internal terminal when an ESD surge is applied from the input terminal. When a voltage applied to the internal circuit or an electric current flowing to the internal circuit is larger than a predetermined value, an excess electric current instantaneously flows to the ESD protection circuit. Thus, the ESD protection circuit is designed so as to prevent a breakdown of the internal circuit. There have been proposed several ESD protection circuits each having a metal oxide semiconductor FET (MOSFET) formed on an SOI substrate.

Japanese Patent Kokai No. 2002-76131 (document D1) discloses a technology of forming an R-C circuit utilized for triggering an electrostatic discharge protection. The R-C circuit includes a trench capacitor and a resistive element which are formed in an SOI substrate. The R-C circuit in document D1 is utilized to provide a time constant of the trigger operation.

Japanese Patent Kokai No. 2002-324842 (document D2) discloses a semiconductor protection circuit having an NMOS as a protection device for protecting an SOI semiconductor circuit from ESD. In document D2, a PMOS is conductive at a time when a stress of the ESD is applied, and thus a positive voltage is applied onto a semiconductor substrate. Owing to a substrate bias effect, a threshold voltage of the NMOS is decreased and a trigger voltage having a snapback characteristic is decreased. In document D2, it is suggested that the PMOS may be replaced by a capacitor.

Japanese Patent Kokai No. 2006-86239 (document 3) discloses a semiconductor device including a layered substrate, a removed part, a cavity part, an ESD protection circuit and a semiconductor element. The layered substrate has a plurality of regions which are overlaid with each other. Upper parts of a semiconductor layer, an insulating layer, and a bulk layer, formed in a first region of the layered substrate are removed so as to form the removed part. An upper part of a bulk layer of a second region adjacent to the removed part is removed so as to form the cavity part. The ESD protection circuit is formed on the bulk layer of the removed part. The semiconductor element is formed in at least one part of the second region of the semiconductor layer. The document D3 states to form an ESD protection circuit which effectively functions for a semiconductor device having an SOI structure having a silicon layer with a thin thickness.

Japanese Patent Kokai No. 2005-93802 (document D4) discloses a method of modeling electric characteristics of an ESD protection device, which method is utilized for simulating a circuit including an ESD protection device. The method includes a parameter configuration step and a modeling step. In the parameter configuration step, at least one specific parameter, which will influence the electric characteristics of the ESD protection device, is configured. In the modeling step, the electric characteristics of the ESD protection device are modeled on the basis of the specific parameter. Accordingly, a change in characteristics of the ESD protection device can be easily expected or evaluated.

A document entitled "ESD protection for SOI technology using under-the-BOX (substrate) diode structure", A. Salman et al., AMD, EOS/ESD symp., 4B.2, 2004 (document 5) suggests that an ESD protection circuit formed on an SOI substrate is thermally damaged by an increased temperature due to a self-heating because the ESD is surrounded by an insulating film of low thermal conductivity. Document 5 also suggests that a breakdown voltage and electric consumption (I: surge electric current×surge voltage) contributing the heat generation should be decreased. In order to lower the breakdown voltage, a method of increasing a substrate electric potential Vsub during an operation of an ESD protection circuit is described to be effective in document D2.

However, for the purpose of preventing destruction of an ESD protection circuit, it is desirable not only to lower the breakdown voltage but also to enhance a durability against thermal destruction that is caused by a higher electric consumption.

SUMMARY OF THE INVENTION

It is an object of the present invention to provide a semiconductor integrated circuit having an ESD protection circuit that enhances a durability against thermal destruction.

According to a first aspect of the present invention, there is provided a semiconductor integrated circuit configured by a plurality of MOSFETs each having an SOI structure formed on a silicon substrate. The semiconductor integrated circuit includes a functional circuit having a signal terminal, a pair of power terminals and at least one of the MOSFETs. The semiconductor integrated circuit also includes at least one ESD protection circuit having a first terminal and a second terminal connected to the signal terminal and the power terminals, respectively. The ESD protection circuit includes at least one first MOSFET of the MOSFETs, the first MOSFET having a drain connected to the first terminal, a gate connected to the second terminal and a source connected to the second terminal. The ESD protection circuit also includes at least one second MOSFET of the MOSFETs formed adjacent to the first MOSFET, the second MOSFET having a gate connected to the first terminal and the same conductivity type as the first MOSFET.

In the semiconductor integrated circuit according to the present invention, a capacitive transistor is provided, with which the substrate electric potential can be adjusted and reverse face channel can be formed. Therefore, the ESD protection circuit, which enhances a durability against thermal destruction, can be provided.

BRIEF DESCRIPTION OF THE DRAWINGS

FIG. 6 is a graph showing time characteristics of a substrate electric potential of the ESD protection transistor.

DETAILED DESCRIPTION OF THE INVENTION

An embodiment in accordance with the present invention will now be described with reference to the accompanying drawings.

Figure 1:
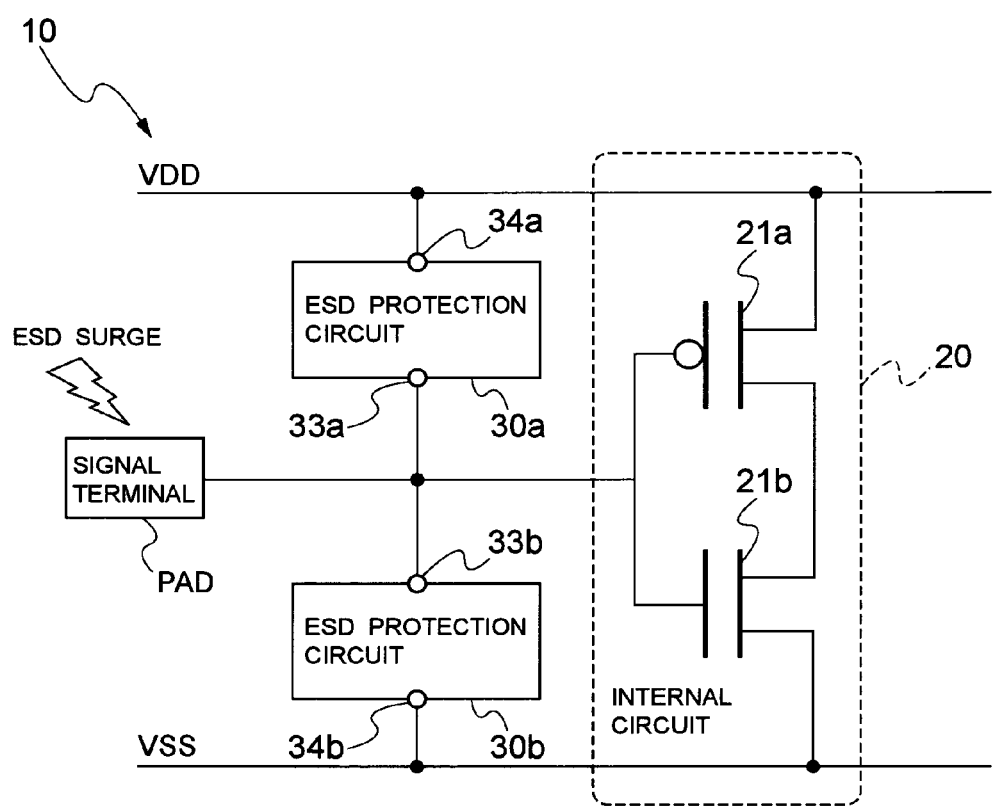
FIG. 1 is a block diagram showing a semiconductor integrated circuit of an embodiment of the present invention.

FIG. 1 illustrates a block diagram showing a semiconductor integrated circuit of an embodiment of the present invention. As shown in FIG. 1, the semiconductor integrated circuit 10 has MOS-SOI structures. In the semiconductor integrated circuit 10, a plurality of MOS-FETs (Field Effect Transistors), each of which has a gate region, a source region, and a drain region, are integrated. The gate, source, and drain regions of each MOS-FETs are formed on an active silicon layer (SOI layer). The SOI layer is formed on an embedding oxide film (BOX layer) formed on a silicon substrate (bulk substrate).

The semiconductor integrated circuit 10 includes an internal circuit 20 which is a functional circuit having a predetermined function. The internal circuit 20 is connected across a pair of power supply terminals VDD and VSS and also connected to a signal terminal PAD. For the pair of power supply terminals VDD and VSS, a difference electric potential is applied. The internal circuit 20 is typically composed of a plurality of transistors. As shown in FIG. 1, the signal terminal PAD is connected to gate terminals of two transistor 21a and 21b. The transistor 21a has a source terminal connected to the power supply terminal VDD, and also has a drain terminal connected to a source terminal of the transistor 21b. The transistor 21b has a drain terminal connected to the power supply terminal VSS.

The semiconductor integrated circuit 10 includes a plurality of ESD protection circuits 30a and 30b, both of which are identical in structures to each other. The ESD protection circuit 30a has a first terminal 34a connected to the power supply terminal VDD, and also has a second terminal 33a connected to the signal terminal PAD. The ESD protection circuit 30b has a first terminal 33b connected to the signal terminal PAD, and also has a second terminal 34b connected to the power supply terminal VSS. For instance, when a surge voltage is applied to the signal terminal PAD, either one of the ESD protection circuits 30a or 30b flows a surge current into the power terminal VDD or VSS in response to polarities of the surge voltage, thus preventing an electrostatic breakdown of the internal circuit 20.

Figure 2:
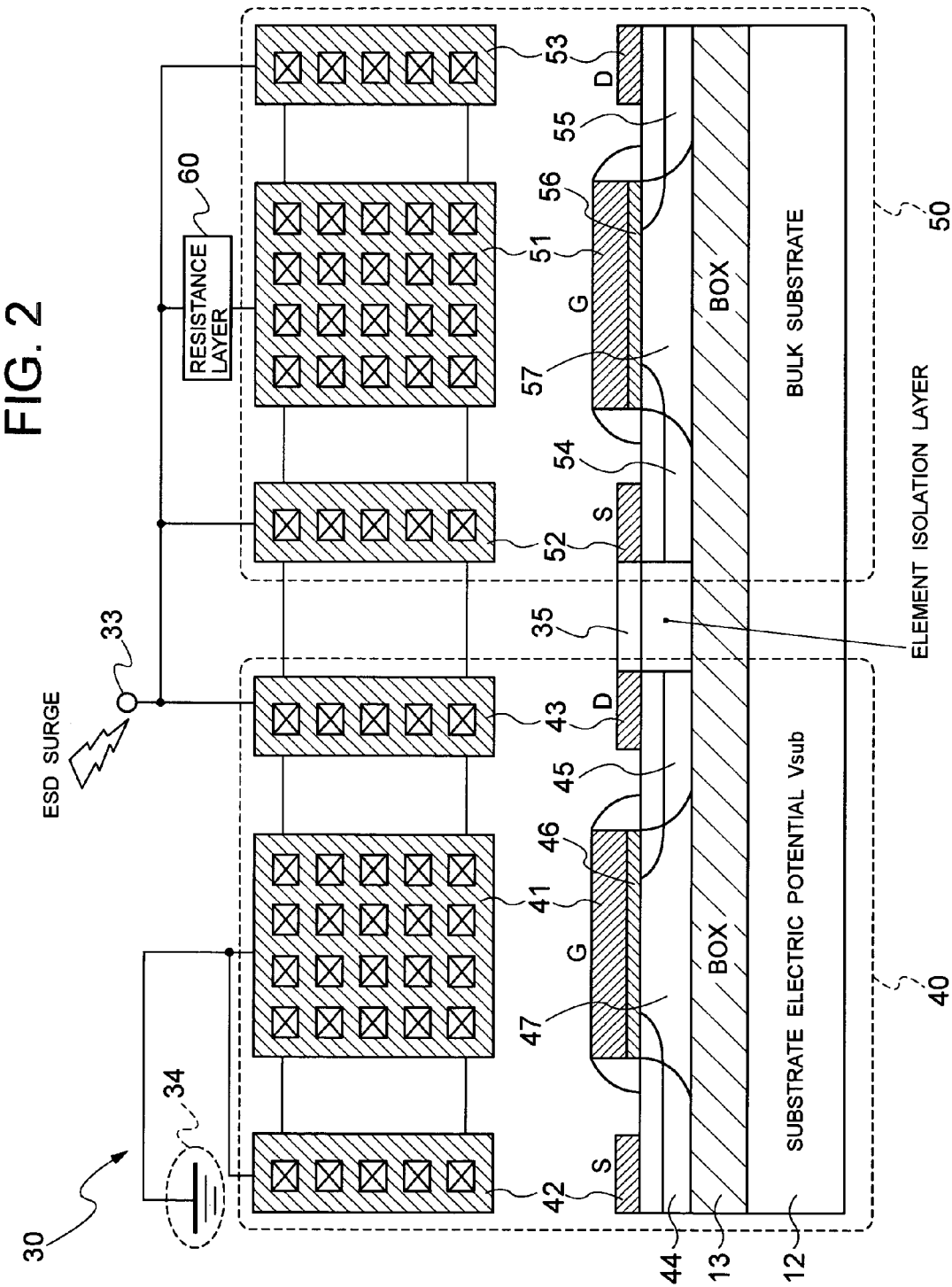
FIG. 2 is a top view and a cross sectional view showing an ESD protection circuit of FIG. 1.

In the embodiment, the internal circuit 20 operates as an input circuit receiving an input signal from the signal terminal PAD. The internal circuit 20 may operate as an output circuit providing an output signal to the signal terminal PAD. FIG. 2 shows a structure of the ESD protection circuit of FIG. 1. In FIG. 2, one of the ESD protection circuits 30a and 30b of FIG. 1 is shown as an ESD protection circuit.

As shown in an upper part of FIG. 2, which is a top view of the ESD protection circuit 30, the ESD protection circuit 30 is composed of an ESD protection transistor 40 which is a first transistor and a capacitive transistor 50 which is a second transistor. The ESD protection transistor 40 and the capacitive transistor 50 have respective SOI structures formed on a bulk substrate 12 and a BOX layer 13. The ESD protection transistor 40, which is a protection device for flowing a surge current, has gate and source terminals 41, 42 connected to a second terminal 34, and has a drain terminal connected to a first terminal 33, thus forming a Gate-Grounded MOS structure. It should be noted that the first terminal 33 of FIG. 2 corresponds to the first terminals 33a or 33b and the second terminal 34 of FIG. 2 corresponds to the second terminals 34a and 34b. The ESD protection transistor 40 flows a surge electric current to the second terminal 34 owing to the avalanche effect in response to a surge voltage applied to the terminal 43. The surge electric current flows when the surge voltage is larger than a predetermined breakdown voltage whose polarity is inverse to the surge voltage.

The capacitive transistor 50 functions to adjust a substrate electric potential Vsub on the bulk substrate 12 via a capacitance between the capacitive transistor 50 and the bulk substrate 12 when the ESD protection transistor 40 operates. The capacitive transistor 50 has source and drain terminals 52, 53 connected to the first terminal 33, and also has a gate terminal connected to the first terminal 33 via a resistive layer 60. The resistive layer 60 is provided for protecting a gate oxide film 56, so that a surge voltage larger than a withstand voltage can not be applied to the gate oxide film 56 of the capacitive transistor 50. If the resistive layer 60 having a larger resistivity is provided, the gate oxide film 56 is sufficiently protected, but a response speed is delayed. Thus, it is necessary to provide a resistive layer 60 having an optimal resistance. For instance, the resistive layer 60 has a resistance of 500Ω as a standard resistance value. The resistive layer 60 may be omitted, and in this case, the gate electrode 51 is directly connected to the first terminal 33. The resistive layer 60 is formed with several methods as follows: In a first method, the resistive layer 60 is formed by forming a non-doped poly-silicon layer, which is not implanted, on an upper surface of the gate electrode. In a second method, the resistive layer 60 is formed by forming a diffusion layer in a semiconductor region in which the gate electrode is also formed, and electrically connecting the diffusion layer to the gate electrode via a wire. The first method is more preferable for the purpose that the resistive layer 60 is formed relatively small in area.

As shown in a lower part of FIG. 2, which illustrates a cross-sectional view of ESD protection circuit 30, the ESD protection transistor 40 has a one transistor structure. The ESD protection transistor 40 includes a source region 44, a drain region 45, a body region 47, and a gate electrode 41. The source region 44 and the drain region 45 are formed by injecting ions into the SOI layer preliminarily formed on the BOX layer 13. The body region 47 is formed in the SOI layer so as to sandwich the source region 44 and the drain region 45. The gate electrode 41 consisting of a poly-silicon film is formed on the gate oxide film 46 deposited on the body region 47. The ESD protection transistor 40 may be configured by a p-type MOS transistor or an n-type MOS transistor. The source region 44 is electrically connected to the source electrode 42. The drain region 45 is electrically connected to the drain electrode 43. The capacitive transistor 50 is formed in parallel to the ESD protection transistor 40 via an element isolation layer 35.

The capacitive transistor 50 has a one transistor structure. The capacitive transistor 50 includes a source region 54, a drain region 55, a body region 57, and a gate electrode 51. The source region 54 and the drain region 55 are formed by injecting ions into the SOI layer preliminarily formed on the BOX layer 13. The body region 57 is formed in the SOI layer so as to sandwich the source region 54 and drain region 55. The gate electrode 51 consisting of a poly-silicon film is formed on the gate oxide film 56 deposited on the body region 57. The capacitive transistor 50 may be configured by a p-type MOS type transistor structure or an n-type MOS transistor. The source region 54 is electrically connected to source electrode 52, and the drain region 55 is electrically connected to the drain electrode 53. The capacitive transistor 50 has a predetermined capacitance. The gate electrode 51, the source region 54, and the drain region 55 are basically connected to the first terminal 33. Both of the ESD protection transistor 40 and the capacitive transistor 50 are formed on the same bulk substrate 12. The capacitive transistor 50 is electrically connected in parallel to the ESD protection transistor 40 among the drain terminal 43 of the ESD protection transistor 40 and the bulk substrate 12.

It should be noted that the ESD protection circuit 30 may includes one ESD protection transistor and two or more capacitive transistors. It is preferable that the ESD protection transistor 40 and capacitive transistor 50 are adjacently formed on the bulk substrate 12 as shown in FIG. 2.

Figure 3:
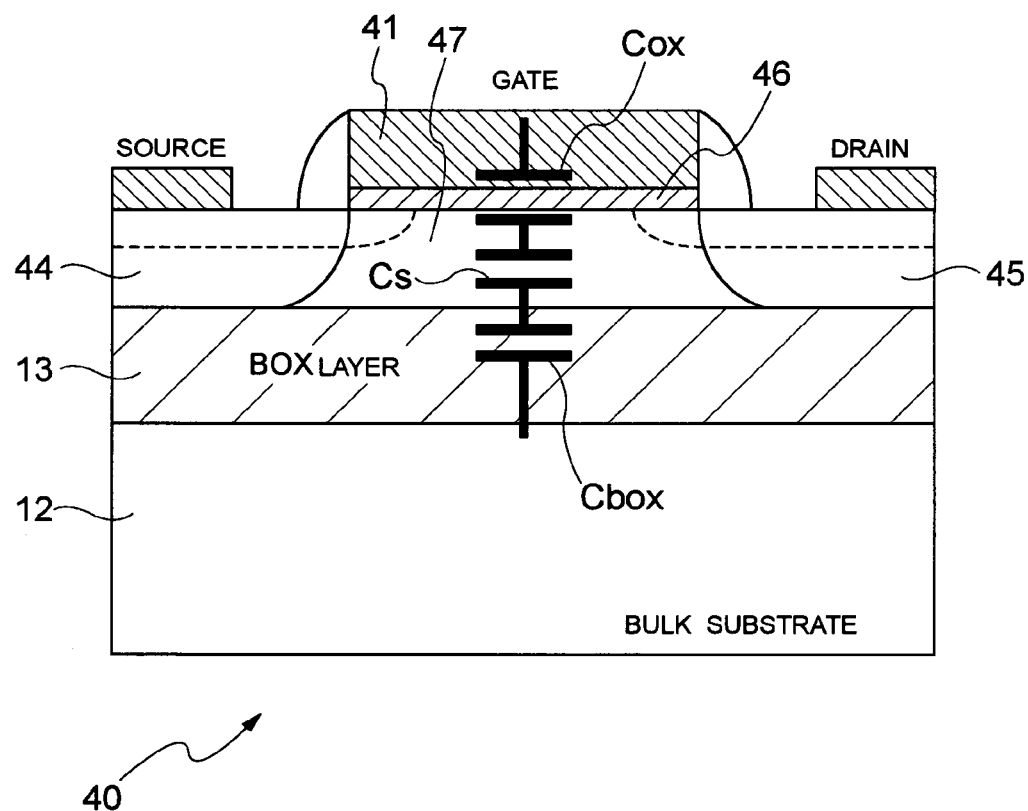
FIG. 3 is an explanatory diagram showing capacitance characteristics of a capacitive transistor.

FIG. 3 illustrates capacitance characteristics of the capacitive transistor. When capacitances of a gate oxide film, a depletion layer of an SOI layer, and a BOX layer, which is connected in series, are defined as $C_{ox}$, $C_s$, and $C_{box}$, respectively, a total capacitance of the capacitive transistor 50 $C_{total}$ is represented as follows:

$$C_{total} = C_{ox} \times C_s \times C_{box}/(Cs \times C_{box} + C_{ox} \times C_{box} + C_{ox} \times C_s)$$

Here, specific values are discussed. Specific inductive capacities of Si and $SiO_2$ are 11.7 and 3.9, respectively. A capacitive transistor 50 having a gate length of 5 nm, a gate width of 100 nm, a gate oxide film thickness of 7 nm, an SOI layer thickness of 50 nm, and a BOX layer thickness of 115 nm has a total capacitance $C_{total}$ of $1.2e^{-13}$F, where "e" represents the base of natural logarithms (i.e. 2.718 . . . ). A capacitive transistor 50 having a gate length of 500 nm, a gate width of 1000 nm, a gate oxide film thickness of 7 nm, an SOI layer thickness of 50 nm, and a BOX layer thickness of 115 nm has a total capacitance $C_{total}$ of $1.2e^{-13}$F, where "e" represents the base of the natural logarithms. The total capacitances $C_{total}$ in the two cases are changed by adjusting the gate length and gate width. In this way, the total capacitance $C_{total}$ is adjusted so as to have a predetermined value.

It is preferable that the capacitive transistor 50 has a total capacitance $C_{total}$ of, for example, $C=1E^{-15}$ or more (E is the base of the natural logarithms). The total capacitance is preferably larger in a view of an increase of an electric current flowing into the protection transistor by forming a back channel. A larger capacitance is obtained by increasing area of the gate electrode and making the BOX layer thinner. However, the larger capacitance will increase the delay, so that an electric potential is not effectively applied on the substrate at the moment that a surge electric current flows to the protection transistor. Therefore, it is necessary to select an optimal capacitance value paying an attention to a balance between a thickness of the BOX film and a concentration of the SOI layer substrate.

In the embodiment, the ESD pulse is applied only on the gate terminal of the capacitive transistor 50 for simplicity of the description. The ESD pulse may be applied on the source and drain terminals of the capacitive transistor 50 excluding the gate terminal. Specifically, there are three cases of the ESD pulse application. In a first case, the ESD pulse is applied not only to the gate terminal but also the source and gate terminals. In a second case, the ESD pulse is applied only on the gate terminal, and is not applied on the source and drain terminal. In a third case, the ESD pulse is not applied on the gate terminal, but applied on the source and drain terminal. In the first case, a capacitance between the gate and the substrate and a capacitance between the source/drain and the substrate are connected in parallel, so that the total capacitance increases. A transient electric current flowing to the substrate increases, thus increasing a bias voltage at the substrate, but which will cause delay. In the second case, the total capacitance value is smaller than that of the first case, but a delay in the second case is smaller than that of the first case. In the third case, a distortion of the gate oxide film can be effectively prevented when a gate resistor is not provided because the gate oxide film having a thicker thickness and a large area can not be formed. One of the cases should be selected according to characteristics of the ESD protection device and the internal circuit. The first case is more preferable if a larger capacitance value is necessary.

Moreover, it is necessary that the BOX layer is not distorted in response to a surge voltage. A withstand voltage in the case of a BOX film having, for example, a 0.05 nm thickness is 100V. When the circuit is configured such that an ESD pulse is applied on both the ESD protection transistor 40 and the capacitive transistor 40 of the ESD protection circuit via a resistance of 15000, a substantial voltage of about 20V is applied. Therefore, a thickness 115 nm of the BOX layer is enough.

Figure 4:
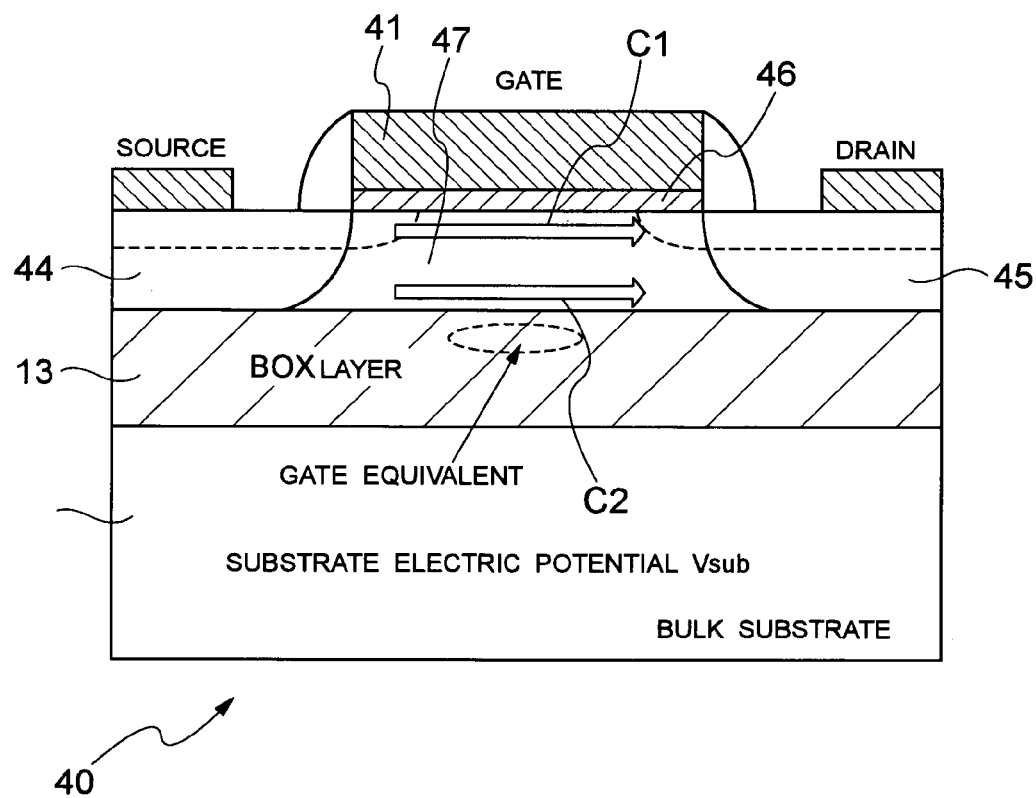
FIG. 4 is an explanatory diagram showing an operation of the ESD protection circuit.

FIG. 4 illustrates an operation of the ESD protection circuit. A capacitance of the capacitive transistor, a surge voltage, and a transient current flowing to the capacitive transistor are defined as C, V, I, respectively.

In response to an ESD pulse applied to the first terminal 33, a surface channel C1, which is an inversion layer, causes below an upper surface of the body region 47 in the ESD protection transistor 40. Career flows from the drain region 45 to the source region 44 via the surface channel C1, thus causing a transient electric current. The transient current I corresponding to $C \times dV/dt$ (t: time) flows to the capacitive transistor connected in parallel to the ESD protection transistor 40, thus increasing the substrate electric potential Vsub, which is referred as a substrate bias effect. As a result, the breakdown voltage of the ESD protection transistor 40 can be substantially decreased.

In addition, the increase of the substrate electric potential Vsub forms a gate equivalent region in the BOX layer 13, the region corresponding to the gate, thus inducing a reverse surface channel C2, which is an inversion layer, in the body region 47 adjacent to the BOX layer 13. With respect to the reverse surface channel C2, the gate oxide film 46 and the bulk substrate correspond to the BOX layer and gate, respectively. As a result, careers flow from the drain region 45 to the source region 44 through the reverse surface channel C2, thus additionally increasing the surge electric current. Since the surge electric current flow through the surface channel C1 and the reverse surface channel C2 of the ESD protection transistor 40, it is possible to decrease the breakdown voltage, increase the surge electric current flow, and divaricate the surge electric current into two current paths, thus enhancing a durability against a thermal breakdown.

It should be noted that the BOX layer preferably has a sufficient thickness so that the inverse channel C2 is formed via a capacity C of the capacitive transistor when a voltage is applied at a normal operation such as a power-on operation.

Figure 5:
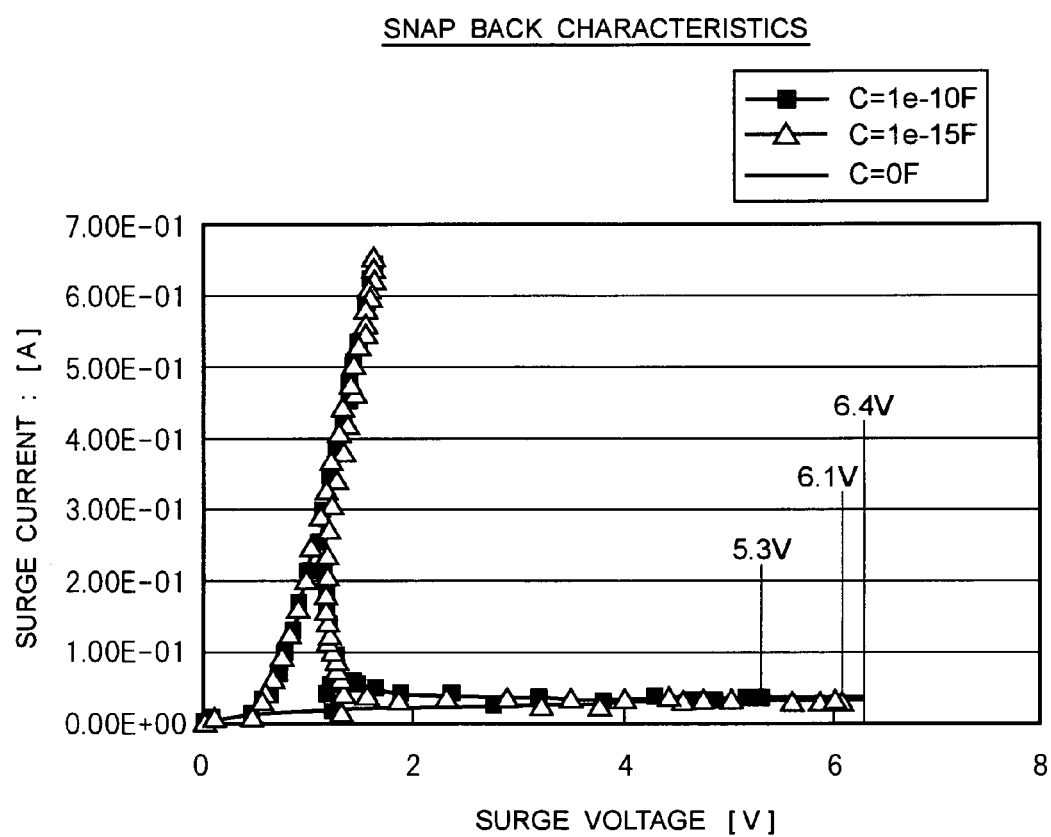
FIG. 5 is a graph showing snap-back characteristics of an ESD protection transistor.

FIGS. 5 and 6 are graphs showing respective characteristics of the ESD protection circuit. The characteristics shown in FIGS. 5 and 6 are demonstrated by using a modeling approach and an ES simulation method of the ESD protection circuit disclosed in document D4. Three results in FIGS. 5 and 6 are shown, which are simulated with an ESD pulse voltage of 1000V and the capacitance transistor of three capacitances C of $1.0 \times e^{-10}$F, $1.0 \times e^{-10}$F, and 0F, respectively. The ESD pulse voltage of 1000V corresponds to an electric potential assumed on the basis of a HBM (Human Body Model). The sign "e" or "E" denoted in FIGS. 5 and 6 the base of the natural logarithms.

Snap-back characteristics of the ESD protection transistor are shown in FIG. 5. The vertical axis and horizontal axis denote a surge voltage and a surge electric current, respectively. In response to an applied ESD pulse, a surge voltage steeply increases at a leading edge. When the surge voltage reaches a breakdown voltage, the ESD protection transistor operates, and thus the surge current flows and the surge voltage steeply decreases. As shown in FIG. 5, snap-back characteristics of the ESD protection transistor are shown since the surge electric current steeply increases and approaches to zero.

In the graph shown in FIG. 5, it is estimated that the breakdown voltages in cases that capacitances C are 0F, $1.0 \times e^{-15}$F, and $1.0 \times e^{-10}$F are 6.4V, 6.1V, and 5.3V, respectively. It is understood from the simulation results of FIG. 5 that the breakdown voltage decreases as the capacitances of the capacitive transistor increases.

Time characteristics of substrate electric potential of the ESD protection transistor are shown in FIG. 6. The vertical axis and horizontal axis of FIG. 6 denotes a substrate electric potential Vsub and time, respectively. In response to an applied ESD pulse, a surge voltage steeply increases at a leading edge, and thus the substrate electric potential Vsub steeply increases because of capacitance characteristics of the capacitive transistor. Then, the substrate electric potential Vsub decreases. The increase of the substrate electric potential Vsub decreases a substantial breakdown voltage of the ESD protection transistor owing to the substrate bias effect.

In the graph shown in FIG. 6, it is estimated that maximum substrate electric potentials in cases that capacitances C are 0F, $1.0 \times e^{-15}$F, and $1.0 \times e^{-10}$F are 0.0V, 2.2V, and 5.2V, respectively. It is understood from the simulation results of FIG. 6 that the maximum substrate electric potential increases as the capacitances of the capacitive transistor increases, and thus making appropriate substrate bias effects corresponding to the capacitance values.

A circuit configuration, in which the capacitive transistor is replaced by a transistor for the purpose of making the substrate bias effect, is known. However, the configuration is not preferable because of a leakage electric current generation. The leakage electric current generates since a voltage is applied on the substrate at a normal operation such as a case that a power supply voltage is applied on the terminal.

In addition, a circuit configuration, in which the capacitive transistor is replaced by a transistor and a resistor for the purpose of increasing the surge electric current of the protection transistor by applying a substrate bias voltage, is known. Such the circuit configuration is different from the embodiment of the present invention in which the capacitive transistor is provided. In the circuit configuration with the transistor and the resistor, a leakage electric current causes when a voltage at a normal operation is applied on the signal terminal. In the present invention, an electric current flowing to the capacitor is absorbed, so that an electric current flows at a normal operation. And the ESD protection circuit operates at the time when a transitional ESD surge is applied.

As described in the embodiments, the semiconductor integrated circuit in accordance with the present invention includes the ESD protection transistor to which the capacitive transistor is connected in parallel. In the semiconductor integrated circuit in accordance with the present invention, the substrate electric potential is increased if the ESD pulse is applied, and thus the breakdown voltage is decreased. In addition, the reverse surface channel formation increase a surge electric current flow, thus enhancing a durability against a thermal distortion. Furthermore, in the semiconductor integrated circuit in accordance with the present invention, a necessary ESD protection performance is attained without an excessive increase of the number of manufacturing processes.

The functional circuit of the semiconductor integrated circuit in accordance with the present invention, which may not be limited to the embodiment having a specific function, can be adopted to functional circuits having various functions such as a multipurpose CPU and a mobile device.

This application is based on Japanese Patent Application No. 2007-068146 which is herein incorporated by reference.

What is claimed is:

1. A semiconductor integrated circuit, comprising: a functional circuit having a signal terminal and a pair of power terminals; and an ESD protection circuit having a first terminal and a second terminal connected to said signal terminal and one of said power terminals, respectively, wherein said ESD protection circuit includes: a first MOSFET having a drain connected to said first terminal, a gate connected to said second terminal and a source connected to said second terminal, and a second MOSFET formed adjacent to said first MOSFET and having the same conductivity type as said first MOSFET, said second MOSFET having a source, gate, and drain, the source, gate, and drain of the second MOSFET all being connected to said first terminal, wherein said functional circuit includes at least one additional MOSFET, wherein said first MOSFET, said second MOSFET, and said at least one additional MOSFET each have an SOI structure formed on a silicon substrate, and wherein said gate of said second MOSFET is connected to said first terminal via a resistance region.

2. A semiconductor integrated circuit according to claim 1, wherein said gate of said second MOSFET is connected to said first terminal via a resistance region.

3. A semiconductor integrated circuit according to claim 1, wherein said second MOSFET further includes:
    a substrate electric potential adjusting mean for adjusting a substrate electric potential on said silicon substrate in response to an ESD pulse applied to said signal terminal; and
    a reverse surface channel forming means for forming a reverse surface channel in said second MOSFET by adjusting said substrate electric potential.

4. A semiconductor integrated circuit according to claim 1, wherein a total capacitance of a capacitance between said gate of said second MOSFET and said silicon substrate and a capacitance between said drain or source of said second MOSFET and said silicon substrate is equal to or larger than $C=1.0 \times e^{-15}$F (where e is approximately 2.718).

5. A semiconductor integrated circuit according to claim 1, further comprising another ESD protection circuit, the another ESD protection circuit having a terminal that is connected to the signal terminal and a further terminal that is connected to the other of said power terminals.

6. A semiconductor integrated circuit according to claim 5, wherein the another ESD protection circuit includes a third MOSFET of said MOSFETs, the third MOSFET having a drain that is connected to the signal terminal, a gate that is connected to the other of said power terminals, and a source that is connected to the other of said power terminals, and a fourth MOSFET of said MOSFETs, the fourth MOSFET having a gate that is connected to the signal terminal and having the same conductivity type as the third MOSFET.

7. A semiconductor integrated circuit, comprising: a functional circuit that is connected between first and second power terminals and that receives an input signal at a signal terminal; a first ESD protection circuit that is connected between the first power terminal and the signal terminal; and a second ESD protection circuit that that is connected between the signal terminal and the second power terminal, wherein the first ESD protection circuit includes: a first MOSFET having a source, a gate, and a drain, one of the source and the drain being connected to the signal terminal and the other of the source and the drain being connected to the first power terminal, the gate of the first MOSFET also being connected to the first power terminal, and a second MOSFET having a source, a gate, and a drain, the source and the drain of the second MOSFET both being connected to the signal terminal, wherein the first ESD protection circuit further includes a resistance region, the gate of the second MOSFET being connected to the signal terminal via the resistance layer.

8. A semiconductor integrated circuit according to claim 7, wherein the first ESD protection circuit further includes a resistance region, the gate of the second MOSFET being connected to the signal terminal via the resistance region.

9. A semiconductor integrated circuit according to claim 7, wherein the second ESD protection circuit comprises:

a third MOSFET having a source, a gate, and a drain, one of the source and the drain of the third MOSFET being connected to the signal terminal and the other of the source and the drain of the third MOSFET being connected to the second power terminal, the gate of the third MOSFET also being connected to the second power terminal; and a fourth MOSFET having a source, a gate, and a drain, the source and the drain of the fourth MOSFET both being connected to the signal terminal.

10. A semiconductor integrated circuit according to claim 9, wherein the second ESD protection circuit further includes another resistance region, the gate of the fourth MOSFET being connected to the signal terminal via the another resistance region.

11. A semiconductor integrated circuit according to claim 7, wherein the functional circuit and the first and second ESD protection circuits are fabricated on an SOI substrate.

12. A semiconductor integrated circuit according to claim 7, wherein the functional circuit comprises an inverter having an inverter input terminal that is connected to the signal terminal.

\* \* \* \* \*